United States Patent
Dallavalle

(10) Patent No.: US 6,681,193 B2
(45) Date of Patent: Jan. 20, 2004

(54) METHOD FOR TESTING A CMOS INTEGRATED CIRCUIT

(75) Inventor: Carlo Dallavalle, Cimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 43 days.

(21) Appl. No.: 09/765,502

(22) Filed: Jan. 18, 2001

(65) Prior Publication Data

US 2002/0029124 A1 Mar. 7, 2002

(30) Foreign Application Priority Data

Jan. 18, 2000 (EP) .......................................... 00830021

(51) Int. Cl.$^7$ ............................................. G01R 31/04
(52) U.S. Cl. ...................... 702/117; 702/118; 324/763; 324/72.5
(58) Field of Search ................................ 702/117, 118; 324/76.3, 72.5; 365/185.79; 326/121; 714/733

(56) References Cited

U.S. PATENT DOCUMENTS

| 5,097,206 A | * | 3/1992 | Perner ........................ 714/733 |
| 5,909,398 A | * | 6/1999 | Tanzawa et al. ......... 365/185.29 |
| 6,154,062 A | * | 11/2000 | Sakata et al. ................ 326/121 |

FOREIGN PATENT DOCUMENTS

EP 0 773 448 5/1997 ........... G01R/31/28

* cited by examiner

Primary Examiner—John Barlow
Assistant Examiner—Tung S Lau
(74) Attorney, Agent, or Firm—Lisa K. Jorgenson; Allen, Dyer, Doppelt, Milbrath & Gilchrist, P.A.

(57) ABSTRACT

Testing a CMOS integrated circuit includes establishing a current threshold value, powering the integrated circuit in static and idle conditions, measuring the current absorbed by the integrated circuit and comparing this with the threshold value and accepting or rejecting the integrated circuit if the comparison shows that the current absorbed measured is respectively lower or higher than the threshold value. To improve discrimination between non-faulty and faulty devices, the threshold value is obtained by forming two measurement transistors in the integrated circuit, one n channel and the other p channel, biasing these in the cut-off zone and measuring their sub-threshold currents. Also, the method includes calculating the sub-threshold currents by channel unit of area of the transistors of the integrated circuit using the sub-threshold currents measured and the channel areas of the measurement transistors, obtaining the sum of the channel areas of the transistors that are cut off when the integrated circuit is idle in static conditions, and calculating the current absorbed by the integrated circuit when idle in static conditions using the result of the two operations described above and adding a pre-established current increase to the current absorbed to obtain the threshold value.

13 Claims, 1 Drawing Sheet

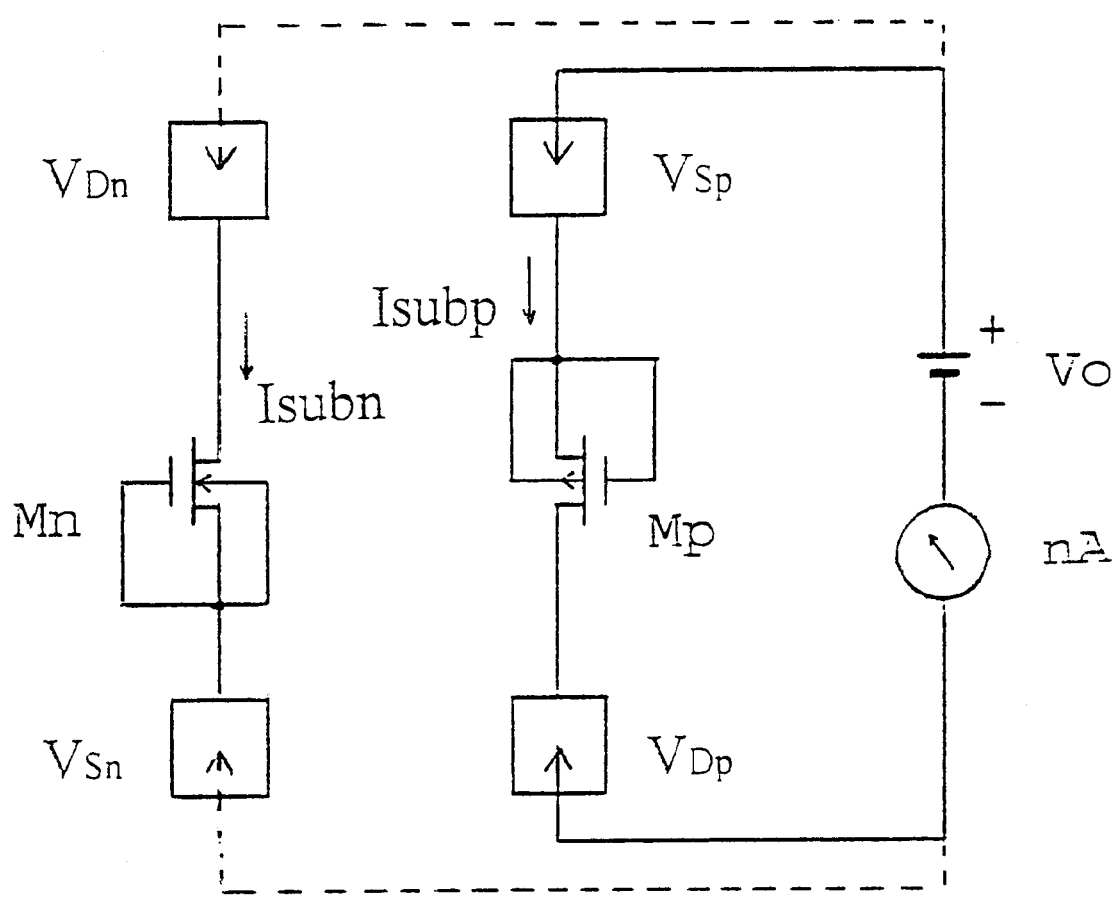

METHOD FOR TESTING A CMOS INTEGRATED CIRCUIT

FIELD OF THE INVENTION

The present invention relates to the field of integrated circuit manufacturing, and, more particularly, to testing of Complementary Metal Oxide Silicon (CMOS) integrated circuits.

BACKGROUND OF THE INVENTION

At the end of the manufacturing process of a plurality of basically identical integrated circuits formed on a wafer of semiconductor material, a final wafer test is carried out on each device using suitable automatic equipment before the devices are separated from each other. Testing includes various electrical measurements intended to ascertain that each device complies with certain functional requirements defined in the design phase. Devices that do not comply with all these requirements are identified so that they can be rejected once the wafer has been divided, whereas the devices that have passed the test are forwarded to the subsequent assembly and encapsulation phases.

When testing large size CMOS digital integrated circuits or mixed digital/analog integrated circuits, one of the parameters on which one of the most significant electrical measurements is made is the idle current in static conditions, i.e. the current that the integrated circuit absorbs when it is connected to the power source but is functionally inactive and in stand-by or power-down mode. This parameter is usually indicated as IDDQ where I indicates the current, DD indicates the D.C. power supply and Q "quiescent" or idle status.

The IDDQ current measured includes the sum of the so-called sub-threshold currents of the MOS transistors, including those that form the memory cells, and of the leakage currents due to manufacturing defects or faulty materials. Further junction leakage currents are at least two orders of size lower and are therefore negligible. If the test specimen is faulty, as will be explained in more detail below, the current measured also includes a contribution provided directly by the fault.

For each integrated circuit under test, the current IDDQ measured is compared in a comparator with a threshold value Ith established previously by examining test specimens of the same device and taking into account suitable margins of tolerance. If the comparison reveals that IDDQ is equal to or higher than Ith, the device tested is identified for subsequent rejection.

The IDDQ test method, i.e. the method based on measurement and comparison of the IDDQ current, is acknowledged as highly significant in CMOS integrated circuit test schedules but is becoming ever more difficult to apply as integrated circuits become increasingly complex, i.e. as integration density and the number of logic gates, which usually indicate the level of complexity of a digital integrated circuit, increase. This is easier to understand considering that, as integration techniques have gradually improved, IDDQ currents have risen in just a short time from the 1 $\mu$A to 10 $\mu$A of integrated circuits containing 1,000–10,000 logic gates based on 1.5–1.0 $\mu$m technology to IDDQ currents of between 100 and 10,000 $\mu$A of integrated circuits containing 100,000–10 million logic gates in 0.5–0.2 $\mu$m technology.

It is known that the contribution of the sub-threshold currents to the IDDQ current increases in proportion to the number of transistors. On the other hand, the threshold current Ith must be established so as to permit identification of a faulty device. In other words, it must be equal to the sum of the IDDQ current measured for a non-faulty device and of a current below the If current due to the presence of even just one electrical defect such as a short-circuit or a floating node in the integrated circuit. As this If current depends basically on the complexity of the integrated circuit, the difference between the IDDQ current measured for a non-faulty device and the Ith current is percentagewise lower the higher the number of transistors of the integrated circuit. For example, if the IDDQ current for a device without electrical defects is 10 $\mu$A and if the If current due to a defect is at least 50 $\mu$A, the threshold current Ith can be set to 60 $\mu$A, i.e. six times the IDDQ of a non-faulty device. If, on the other hand, the IDDQ of a non-faulty device is 1 mA, the threshold voltage Ith must be set to 1.05 mA, i.e. to a value that differs from the IDDQ of a non-faulty device only for a fraction of this (½0th in this example) to avoid the risk of accepting devices with even only one defect that contributes with 50 $\mu$A to the measurement of the IDDQ. In conclusion, in the first case, the difference between IDDQ and Ith is 50 $\mu$A which is 500% of the IDDQ current to be compared and, in the second case, the difference is still 50 $\mu$A, which is however only 5% of the IDDQ current to be compared. Therefore, to ensure that the measurements are reliable also for devices with high integration density, ever more sensitive and therefore complex comparators and increasingly critical measurement procedures must be used.

The inevitable differences between different samples of the same device belonging to different manufacturing lots due to variations in the manufacturing parameters represent a further complication.

In particular, the sub-threshold currents of the MOS transistors which, as already mentioned, represent the highest contribution to the IDDQ current, vary considerably in devices of different lots and also in devices belonging to wafers of the same lot. For example, the IDDQ current measurement in non-faulty devices (which will be indicated below as IDDQN) belonging to different lots may be between 5 and 35 $\mu$A. When the minimum current increase $\Delta$If due to a defect is within the variability range of the IDDQN current, it is difficult to establish a threshold value Ith that allows the comparator to distinguish between acceptable and non-acceptable devices.

In the example given above, the variability range is 30 $\mu$A. If a defect involves an increase $\Delta$If, for example, of 20 $\mu$A, it is impossible to establish a threshold value Ith that makes it possible to reject all the devices with this defect only. The devices with IDDQN=5 $\mu$A, may include one that, with a defect $\Delta$If=20 $\mu$A, returns an IDDQ measurement of IDDQ= 30 $\mu$A, so that a threshold Ith even only slightly above the maximum limit of IDDQN current for non-faulty devices (35 $\mu$A), would not permit identification of the faulty device.

SUMMARY OF THE INVENTION

An object of this invention is to establish a high component density CMOS integrated circuit test method that improves discrimination between non-faulty devices and faulty devices and thus guarantees higher production throughput.

This and other objects are provided by a method fo testing a CMOS integrated circuit including establishing a current threshold value, powering the integrated circuit in static and idle conditions, measuring the current absorbed by the integrated circuit and comparing this with the threshold value and accepting or rejecting the integrated circuit if the comparison shows that the current absorbed measured is respectively lower or higher than the threshold value. To improve discrimination between non-faulty and faulty devices, the threshold value is obtained by forming two measurement transistors in the integrated circuit, one n channel and the other p channel, biasing these in the cut-off zone and measuring their sub-threshold currents. Also, the method includes calculating the sub-threshold currents by channel unit of area of the transistors of the integrated circuit using the sub-threshold currents measured and the channel areas of the measurement transistors, obtaining the sum of the channel areas of the transistors that are cut off when the integrated circuit is idle in static conditions, and calculating the current absorbed by the integrated circuit when idle in static conditions using the result of the two operations described above and adding a pre-established current increase to the current absorbed to obtain the threshold value.

BRIEF DESCRIPTION OF THE DRAWING

The invention will be more readily understood reading the following detailed description of an embodiment of the invention provided purely by way of an illustrative, non-restrictive example referring to the accompanying drawing in which:

The FIGURE is a schematic diagram of an integrated circuit and a testing device for implementing the method of the invention.

DETAILED DESCRIPTION OF THE PREFERRED EMBODIMENTS

According to the invention, a pair of MOS transistors, one n channel and one p channel indicated as Mn and Mp in the FIGURE, are formed in each specimen integrated circuit on which the IDDQ test is to be carried out with the same manufacturing process as the n channel and p channel MOS transistors of the integrated circuit. Both transistors have their respective gate electrodes connected to the respective source electrodes and are therefore biased in the cut-off zone. Their drain and source electrodes are connected to their respective pairs of metal pads VDn, VSn and VDp, VSp that are used to connect the two transistors to the test appliance with the usual contact points identified by arrows in the drawing. The test appliance simply includes a D.C. voltage source Vo in series with an ammeter nA.

With this test arrangement, the sub-threshold currents Isubn, Isubp of the transistors Mn and Mp are measured in the same temperature and power supply conditions that will be used for subsequent measurement of the IDDQ current of the device in which the Mn and Mp transistors are formed. The values measured Isubn, Isubp are stored in the test device together with the channel widths WMn and WMp of transistors Mn and Mp. Considering that all the MOS transistors of the device, including transistors Mn and Mp, have the same channel length, the Isubn/WMn and Isubp/WMp relationships indicate the sub-threshold currents by unit of area for the n channel and p channel MOS transistors of the device. The current IDDQ for a device without faults is therefore given by the following expression:

$$IDDQ = \frac{Isubn}{WMn} \cdot \sum (Wnoff) + \frac{Isubp}{Wmp} \cdot \sum (Wpoff)$$

where Isubn and Isubp indicate the sub-threshold currents measured for the transistors, respectively Mn and Mp, WMn and WMp indicate the channel widths of the same transistors Mn and Mp and $\Sigma(Wnoff)$ and $\Sigma(Wpoff)$ indicate the sums of the channel widths of all the MOS transistors, of the channel n and channel p type respectively which in the measurement conditions of the current IDDQ are cut off and are biased so that a sub-threshold current flows through them.

The sums $\Sigma(Wnoff)$ and $\Sigma(Wpoff)$ can be obtained from the design data of the integrated circuit from which the channel widths of the n channel and p channel transistors are obtained and through computer simulation of the functioning of the integrated circuit in IDDQ current measurement conditions, i.e. on stand-by and in static conditions, to count the number of n channel transistors and p channel transistors that are cut off in these conditions. All the transistors that, although cut off, do not contribute to the current IDDQ because they are not biased in such a way as to conduct a sub-threshold current, such as the so-called "pass transistors" that perform only interconnection functions, must be excluded from the count.

The sums $\Sigma(Wnoff)$ and $\Sigma(Wpoff)$ are stored on the test device as characteristic data of the integrated circuit to be tested, to be used when calculating the current IDDQ of each integrated circuit according to the expression given above.

The channel widths Wn and Wp are determined so that the sub-threshold currents in the measurement conditions are higher than the sensitivity of the IDDQ current measurement instrument. To do this, the channel length that can be obtained with the manufacturing process used must be taken into account. For example, with a 0.5 $\mu$m process, the sub-threshold currents measured at ambient temperature are:

Isubn≅10 pA per $\mu$m of channel width

Isubp≅9 pA per $\mu$m of channel width, respectively for an n channel MOS transistor and for a p channel MOS transistor biased with a voltage between drain and source |VDSp|=VDSn=2.5V, with a voltage between gate and source |VGSp|=VGSn=0V and with a voltage between body and source VBSp=|VBSn|=0V.

Considering a test device with an ammeter able to measure currents not below some tens of nA, it is possible to obtain measurable sub-threshold values constructing measurement transistors Mn and Mp with a channel width W≅10,000 $\mu$m. In this case the sub-threshold current for the two transistors is around 10 pA/$\mu$m·10,000 $\mu$m=100 nA.

If the measurement is made above ambient temperature, the measurement transistors may have a lower channel width in view of the dependence (exponential) of the current Isub on temperature. For example, at a temperature of 70° C., channel width can be reduced to 100 $\mu$m, resulting in a saving of area of the integrated circuit.

The threshold current Ith to be applied at the comparator is calculated by adding, to the IDDQ current calculated, a value $\Delta I$ of current large enough to take into account a single fault present in the smallest of the MOS transistors, i.e. in a p channel MOS transistor (which, as is known, has a conduction current per mm of channel width lower than that of an n channel transistor) conducting during the measurement of IDDQ.

The following relationship must apply for $\Delta I$:

$$\in \leq \Delta I \leq Ion(minW)$$

where $\in$ indicates the error of the measurement instrument of the test appliance in the variation range of the IDDQN currents calculated and Ion(minW) is the current absorbed by the smallest transistor (p channel) of the integrated circuit that conducts during measurement of the IDDQ current.

The Ion(minW) current is established according to the minimum defect that is to be detected. More precisely, it is equal to the short-circuit current if only effective short-circuits are to be detected or it is a fraction higher or lower than the short-circuit current if defects due to more or less strong resistance losses are also to be detected. Also, the value of ΔI must be as close as possible to ∈.

The test device then measures the current IDDQ absorbed by each of the integrated circuits to be tested powered in static and stand-by conditions, compares the current absorbed measured for each integrated circuit with the threshold value Ith established and indicates the integrated circuit as acceptable or non-acceptable if the comparison shows that the current absorbed measured is, respectively, lower or higher than the threshold value.

The same operations as described above are carried out for each integrated circuit under test starting from measurement of the sub-threshold currents of the measurement transistors associated to the integrated circuit.

The method according to the invention makes it possible to modify the measurement parameters specifically for each specimen of integrated circuit under test. Therefore, test operations are not affected by differences between different specimens of the same integrated circuit due to variability in the manufacturing parameters between different lots but also inside the same lot and inside each wafer. The test is therefore much more precise than that using the known method with a drastic reduction in the number of non-faulty devices rejected and with evident benefits for manufacturing throughput. Also, even more important, it is no longer possible for faulty devices to pass the test and to be sold as good.

That which is claimed is:

1. A method for testing an integrated circuit of a plurality of substantially identical integrated circuits having n channel transistors a p channel transistors, the method comprising:

forming an n channel measurement transistor and a p channel measurement transistor in each integrated circuit;

biasing the measurement transistors in a cut-off zone;

measuring sub-threshold currents of the measurement transistors;

calculating sub-threshold currents by unit of channel area for the integrated circuit n channel and p channel transistors from the measured sub-threshold current and from channel areas of the measurement transistors;

obtaining sums of the channel areas of the integrated circuit n channel and p channel transistors that, with the integrated circuit in an idle condition, are in a cut-off condition;

calculating products of the sub-threshold currents by unit of channel area calculated for the sums of the channel areas obtained;

calculating current drawn by the integrated circuit an idle condition by adding together the products;

adding a predefined current increase to the calculated current drawn to establish a current draw threshold;

powering the integrated circuit in an idle condition;

measuring a current drawn by the integrated circuit;

comparing the current drawn with the current draw threshold; and accepting the integrated circuit if the current drawn is lower than the current draw threshold, and rejecting the integrated circuit if the current drawn is higher than the current draw threshold.

2. A method according to claim 1 wherein the channel areas of the n channel and p channel MOS transistors that, with the integrated circuit in an idle condition, are in a cut-off condition, are obtained from dimensional design data of the n channel and p channel transistors and by counting the n channel and p channel transistors in cut-off conditions through computer simulation of an operation of the integrated circuit when in an idle condition.

3. A method according to claim 1 wherein the predefined current increase is selected as less than a current drawn by a smallest integrated circuit transistor that conducts during measurement of the current drawn and higher than a measurement error of a measurement device.

4. A method according to claim 3 wherein the measurement transistors have a size such that the measured sub-threshold currents are greater than a sensitivity of the measurement device for the current drawn by the integrated circuit.

5. A method according to claim 1 wherein the current drawn by the integrated circuit is measured at a predefined temperature that is higher than an ambient temperature.

6. A method for testing an integrated circuit of a plurality of substantially identical integrated circuits having n channel transistors and p channel transistors, the method comprising:

forming an n channel measurement transistor and a p channel measurement transistor in each integrated circuit;

determining sub-threshold currents of the measurement transistors, calculating sub-threshold currents for the integrated circuit n channel and p channel transistors at least from the sub-threshold currents of the measurement transistors;

determining a current drawn by the integrated circuit in an idle condition, based upon sums of channel areas of the integrated circuit n channel and p channel transistors that, with the integrated circuit in an idle condition, are in a cut-off condition;

establishing a current draw threshold based upon the determined current drawn, and including adding a predefined current increase to the determined current drawn;

powering the integrated circuit in an idle condition;

measuring a current drawn by the integrated circuit; and comparing the current drawn with the current draw threshold to accept or reject the integrated circuit.

7. A method according to claim 6, wherein the integrated circuit is accepted if the current drawn is lower than the current draw threshold, and rejected if the current drawn is higher than the current draw threshold.

8. A method according to claim 6, wherein determining sub-threshold currents of the measurement transistors comprises:

biasing the measurement transistors in a cut-off zone; and measuring sub-threshold currents of the measurement transistors.

9. A method according to claim 6, wherein determining the current drawn by the integrated circuit in an idle condition comprises:

calculating products of the sub-threshold currents by unit of channel area based upon the sums of the channel areas;

calculating current drawn by the integrated circuit in an idle condition by adding together the products.

10. A method according to claim 6 wherein the predefined current increase is selected as less than a current drawn by a smallest integrated circuit transistor that conducts during measurement of the current drawn and higher than a measurement error of a measurement device.

11. A method according to claim 10 wherein the measurement transistors have a size such that the measured sub-threshold currents are greater than a sensitivity of the measurement device for the current drawn by the integrated circuit.

12. A method according to claim 6 wherein the channel areas of the n channel and p channel transistors that, with the integrated circuit in an idle condition, are in a cut-off condition, are obtained from dimensional design data of the n channel and p channel transistors and by counting the n channel and p channel transistors in cut-off conditions through computer simulation of an operation of the integrated circuit when in an idle condition.

13. A method according to claim 6 wherein the current drawn by the integrated circuit is measured at a predefined temperature that is higher than an ambient temperature.

* * * * *